United States Patent
Kundu et al.

(10) Patent No.: US 7,385,420 B1
(45) Date of Patent: *Jun. 10, 2008

(54) REPEATABLE BLOCK PRODUCING A NON-UNIFORM ROUTING ARCHITECTURE IN A FIELD PROGRAMMABLE GATE ARRAY HAVING SEGMENTED TRACKS

(75) Inventors: Arunangshu Kundu, San Jose, CA (US); Eric Sather, Palo Alto, CA (US); William C. Plants, Sunnyvale, CA (US)

(73) Assignee: Actel Corporation, Mountain View, CA (US)

( * ) Notice: Subject to any disclaimer, the term of this patent is extended or adjusted under 35 U.S.C. 154(b) by 12 days.

This patent is subject to a terminal disclaimer.

(21) Appl. No.: 11/426,541

(22) Filed: Jun. 26, 2006

Related U.S. Application Data (63) Continuation of application No. 11/120,509, filed on May 2, 2005, now Pat. No. 7,075,334, which is a continuation of application No. 10/330,672, filed on Dec. 27, 2002, now Pat. No. 6,891,396.

(51) Int. Cl.
*H03K 19/177* (2006.01)
*H01L 25/00* (2006.01)

(52) U.S. Cl. .......................................... 326/41; 326/38
(58) Field of Classification Search ............ 326/37–41, 326/47, 101
See application file for complete search history.

(56) References Cited

U.S. PATENT DOCUMENTS 5,742,181 A * 4/1998 Rush ............................ 326/41

* cited by examiner

*Primary Examiner*—Daniel D Chang
(74) *Attorney, Agent, or Firm*—Lewis and Roca, LLP (57) ABSTRACT

A repeatable non-uniform segmented routing architecture in a field programmable gate array comprising: a repeatable block of routing tracks, the routing tracks grouped into sets of routing tracks, each set having a first routing track in a first track position, a second routing track in a last track position, a programmable element, and a direct address device for programming the programmable element; wherein at least one of the routing tracks is segmented into non-uniform lengths by the programmable element and the second routing track crosses-over to the first track position in a region adjacent to an edge of the repeatable block; and wherein a first plurality of the routing track sets proceed in a horizontal direction and a second plurality of the routing track sets proceed in a vertical direction.

13 Claims, 6 Drawing Sheets

REPEATABLE BLOCK PRODUCING A NON-UNIFORM ROUTING ARCHITECTURE IN A FIELD PROGRAMMABLE GATE ARRAY HAVING SEGMENTED TRACKS

CROSS-REFERENCE TO RELATED APPLICATIONS

This application is a continuation of U.S. patent application Ser. No. 11/120,509, filed May 2, 2005 now U.S. Pat. No. 7,075,334, which is a continuation of U.S. patent application Ser. No. 10/330,672, filed Dec. 27, 2002, issued as U.S. Pat. No. 6,891,396, which are hereby incorporated by reference as if set forth herein.

BACKGROUND OF THE SYSTEM

1. Field of the System

The present system relates to field programmable gate array (FPGA) devices. More specifically, the system relates to a routing architecture between logic modules in an FPGA having segmented tracks that can be stepped and repeated such that the segment block only has to be designed once.

2. Background

FPGAs are known in the art. An FPGA comprises any number of logic modules, an interconnect routing architecture and programmable elements that may be programmed to selectively interconnect the logic modules to one another and to define the functions of the logic modules. An FPGA is an array of uncommitted gates with uncommitted wiring channels. To implement a particular circuit function, the circuit is mapped into an array and the wiring channels' appropriate connections are programmed to implement the necessary wiring connections that form the user circuit.

A field programmable gate array circuit can be programmed to implement virtually any set of functions. Input signals are processed by the programmed circuit to produce the desired set of outputs. Such inputs flow from a user's system, through input buffers and through the circuit, and finally back out the user's system via output buffers.

An FPGA core tile may be employed as a stand-alone FPGA, repeated in a rectangular array of core tiles, or included with other devices in a system-on-a-chip (SOC). The core FPGA tile may include an array of logic modules and input/output modules. An FPGA core tile may also include other components such as read only memory (ROM) modules. Horizontal and vertical routing channels provide interconnections between the various components within an FPGA core tile. Programmable connections are provided by programmable elements between the routing resources.

The programmable elements in an FPGA can be either one-time programmable or re-programmable. Re-programmable elements used in FPGA technologies may comprise transistors or other re-programmable elements as is well known to those of ordinary skill in the art. One-time programmable elements used in FPGA technologies may comprise antifuse devices.

Horizontal and vertical routing channels are comprised of a varying number of routing tracks. It is often desirable to segment routing tracks. Segmented routing tracks increase the speed and performance of integrated circuits. For instance, if a particular integrated circuit has long routing tracks due to the size of the device, the time it takes for a signal to travel along the routing tracks may be long due to increased resistance and capacitive loading on the tracks. This is especially true in antifuse FPGAs. Unprogrammed antifuses along the routing tracks act as small capacitors, and thus decrease the performance and speed in antifuse FPGAs. Segmented tracks also reduce die area. Using an entire routing track to route a signal when only a portion of the track is required tends to waste die area.

It is even more desirable if the segmentation of the routing tracks is non-uniform. A non-uniform segmented channel array provides a variety of track lengths, and thus is more flexible and faster than a device having a uniform segmented channel array. Segmented tracks also reduce die area. For example, in a non-uniform segmented channel array, if a signal has to travel a track distance comprising a certain predetermined track length, it is more likely that that track length can be closely matched in a non-uniform segmented channel array due to the variety of track lengths and combinations of track lengths to choose from.

The problems associated with non-uniform segmented channel array architecture arise from a design and verification viewpoint. As is well known to those skilled in the art of integrated circuit design, non-uniform channel array architectures do not lend themselves to modular design. Modular design of integrated circuits involves the designing one portion of the circuit as a small block. The small block is then stepped and repeated across the entire chip. This procedure is known in the art as tiling.

Non-uniform segmented channel array architectures do not lend themselves to modular design due to the unique nature of each non-uniform track segment. Because of this various problems arise when designing a non-uniform segmented channel array. For example, the circuit design of each channel has to be drawn manually for the entire length of the chip. The same circuit design has to be repeated in the software device description. In addition, arrays with non-uniform segmented channels in two dimensions (i.e. horizontal and vertical) have a unique circuit design at each intersection of a horizontal channel and vertical channel in the array. Thus, the mask design and layout has to be repeated for every unique intersection of channels, the number of which tends to grow as the product of the number of channels in each direction grows.

Further, non-uniform segmented channel array architectures greatly increase the complexity of the verification problem. For example, the effort required to verify the circuit design against the architecture, the mask design against the circuit design, the software design against the architecture, etc., is proportional to the number of channel intersections in the array. Manual inspection of each channel track addressing signal and programmable element locations is already error prone and is amplified in the case of non-uniform segmented channel array architectures due to having to check the entire circuit rather than a block that has been repeated throughout the circuit.

Thus, there is a need in the art for a non-uniform segmented channel array architecture that can be designed as a block that may be stepped and repeated to build an entire chip. There is also a need in the art for a non-uniform segmented channel array block, i.e. circuit design, mask design, layout and software device description, that need be designed only once.

SUMMARY OF THE SYSTEM

The presently disclosed system is an apparatus comprising a non-uniform segmented channel array that is generated by the repetition of a single block. The apparatus comprises a repeatable non-uniform segmented routing architecture in a field programmable gate array having a plurality of sets of routing tracks having a first and last track position proceeding in a first direction and having at least one programmable element and at least one direct address device. The tracks are partitioned into uniform lengths and a track in the last position crosses over to a track in the first position immediately prior to said partition. The apparatus of the present system also has a plurality of sets of routing tracks having a first and last track position proceeding in a second direction. The tracks proceeding in the second direction have at least one programmable element and direct address device, wherein the tracks are partitioned into non-uniform lengths and said last track position crosses over to a first track position immediately prior to said partition.

The above-described block is repeatable due to the twisting (or crossing over) of tracks. The abutment of a number of these repeatable blocks generates a routing channel and generating the repetition of the blocks in both dimensions generates a fully segmented-channel routing array.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE DRAWINGS

Those of ordinary skill in the art will realize that the following description of the present invention is illustrative only and not in any way limiting. Other embodiments of the invention will readily suggest themselves to such skilled persons.

The present invention discloses a device and a method of producing non-uniform segmented channel array architectures that can be stepped and repeated to build an entire FPGA circuit. The horizontal and vertical tracks are segmented within a core tile 100 and between core tiles 100 as set forth in FIG. 1 and in greater detail below.

In this application, a track refers to a track that spans the entire chip. For example, a track spans the entire chip, and thus all track lengths are the same. Track segments are portions of the track that are broken via programmable elements into different segment lengths. It is the length of the track segments that are affected by the segmentation.

In this application, non-uniform track segmentation provides both a distribution of segment lengths and a distribution of segment offsets (i.e. starting points). This is because the signals being routed in a channel not only travel different distances but also start at different points, as discussed in greater detail below. The segmentation is non-uniform is both these respects.

Figure 1:
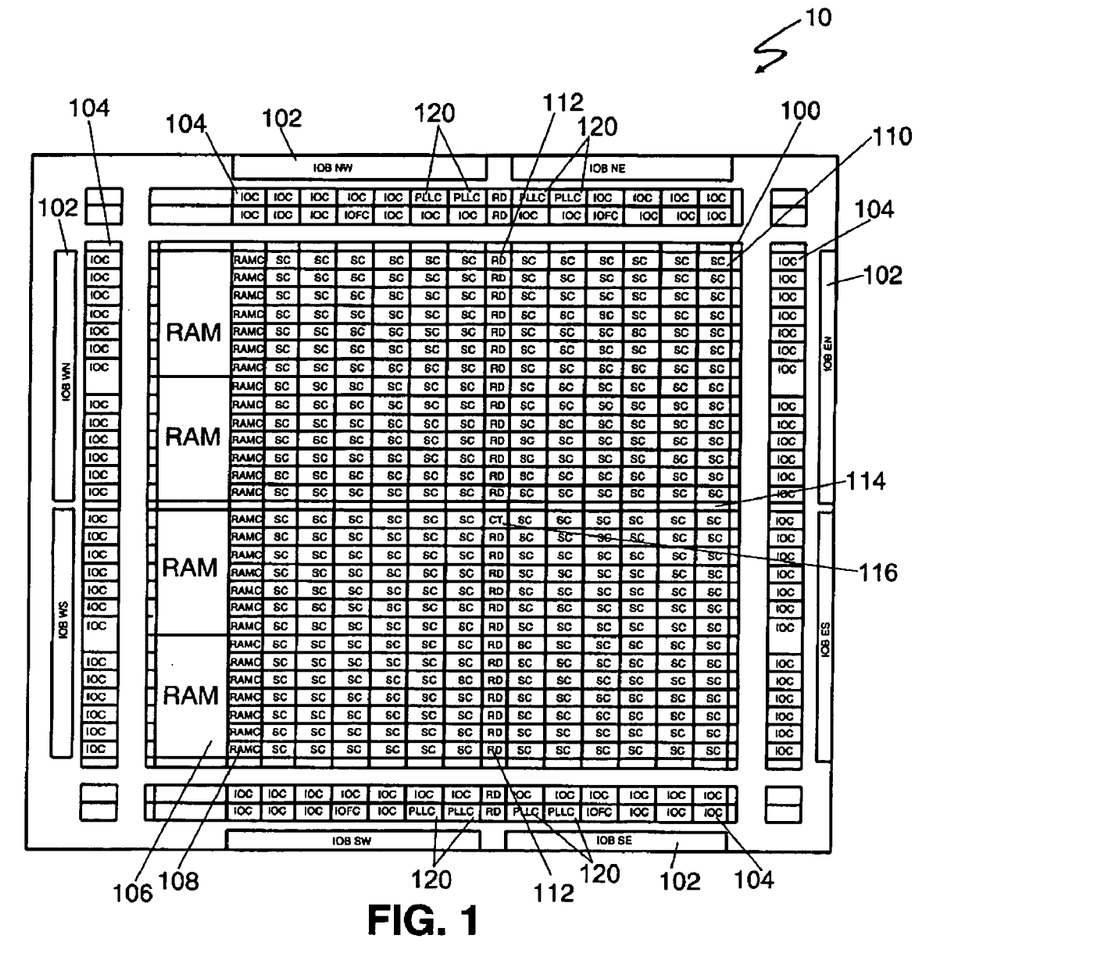
FIG. 1 is a simplified block diagram of an FPGA core tile 100 incorporating the non-uniform segmented routing channel architecture (not shown), as disclosed in the present system.

FIG. 1 is a simplified block diagram of an FPGA 10 having one core tile 100 incorporating the non-uniform segmented routing channel architecture (not shown), as disclosed in the present system. As shown in FIG. 1, core tile 100 comprises an array of logic clusters 110, a column of routed clock clusters 112, a row of hard-wired clock clusters 114, a clock tile cluster 116, a row of RAM clusters 108, RAM memory 106. FPGA core tile 100 is surrounded by two rows of input/output (I/O) clusters 104 and I/O banks 102. In FIG. 1, edges of the device shown are referred to in terms of compass directions, for example, the top edge is designated the "north" side of the device. On the north and south edges surrounding FPGA core tile 100 there are eight phase-locked-loop clusters (PLL clusters) 120.

Figure 2:
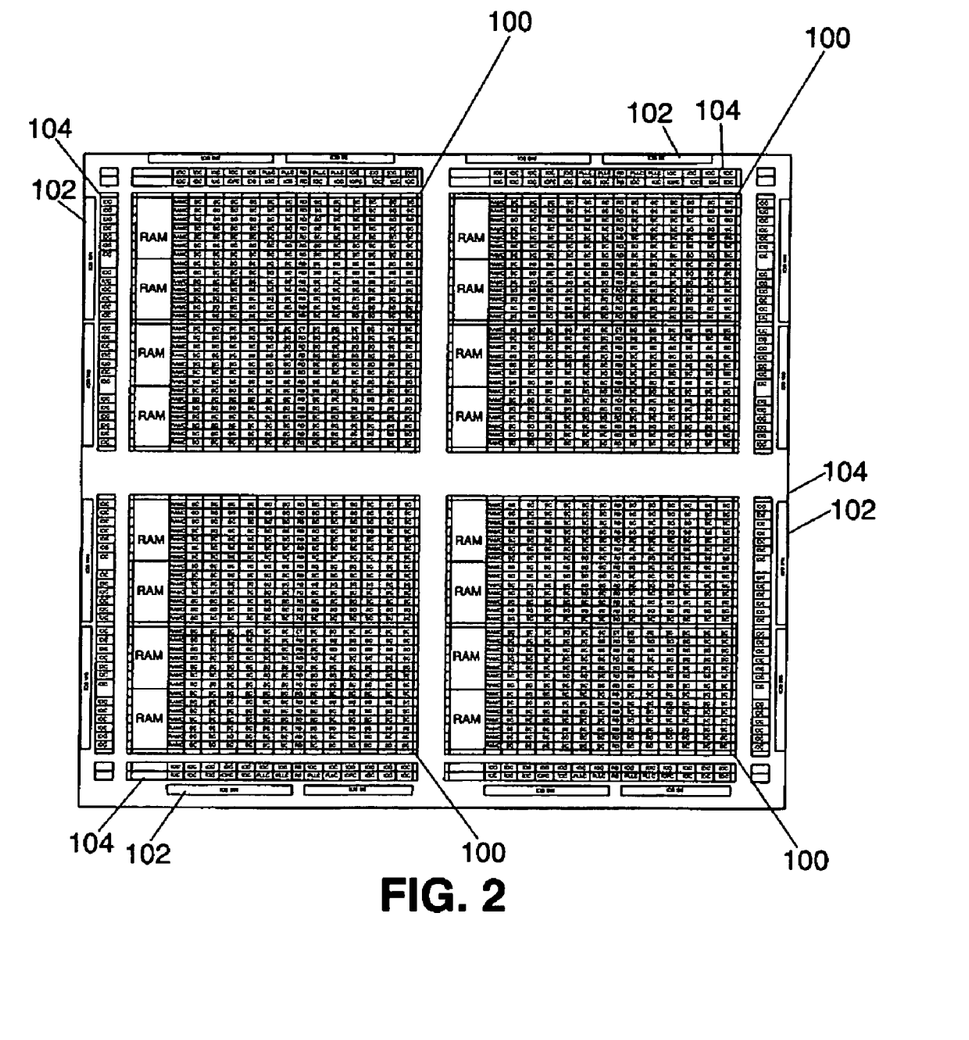
FIG. 2 is a block diagram of an illustrative FPGA including multiple core tiles 100 as shown as an example in FIG. 1.

FIG. 2 is a block diagram of an illustrative FPGA 10 including multiple core tiles 100 as shown as an example in FIG. 1. As shown in FIG. 2, FPGA device comprises four core tiles 100, though other numbers of tiles are possible. Core tiles 100 are surrounded by I/O clusters 104 and I/O banks 102.

The term track refers to a signal routing line that runs the distance of the FPGA. The term "segment" refers to a portion of the track. Each segment of a track is coupled to the next adjacent segment by a programmable element. If the programmable elements are programmed, the segments are electrically connected. In this application, the programmable elements defining each segment of are referred to as "offsets" or starting points of a segment. The term "segmentation pattern group" refers to a horizontal track segment length as wide as a logic cluster or a vertical track segment that equals two logic cluster rows as illustrated in FIG. 1. The segmentation pattern groups repeat in patterns as set forth below.

Figure 3:
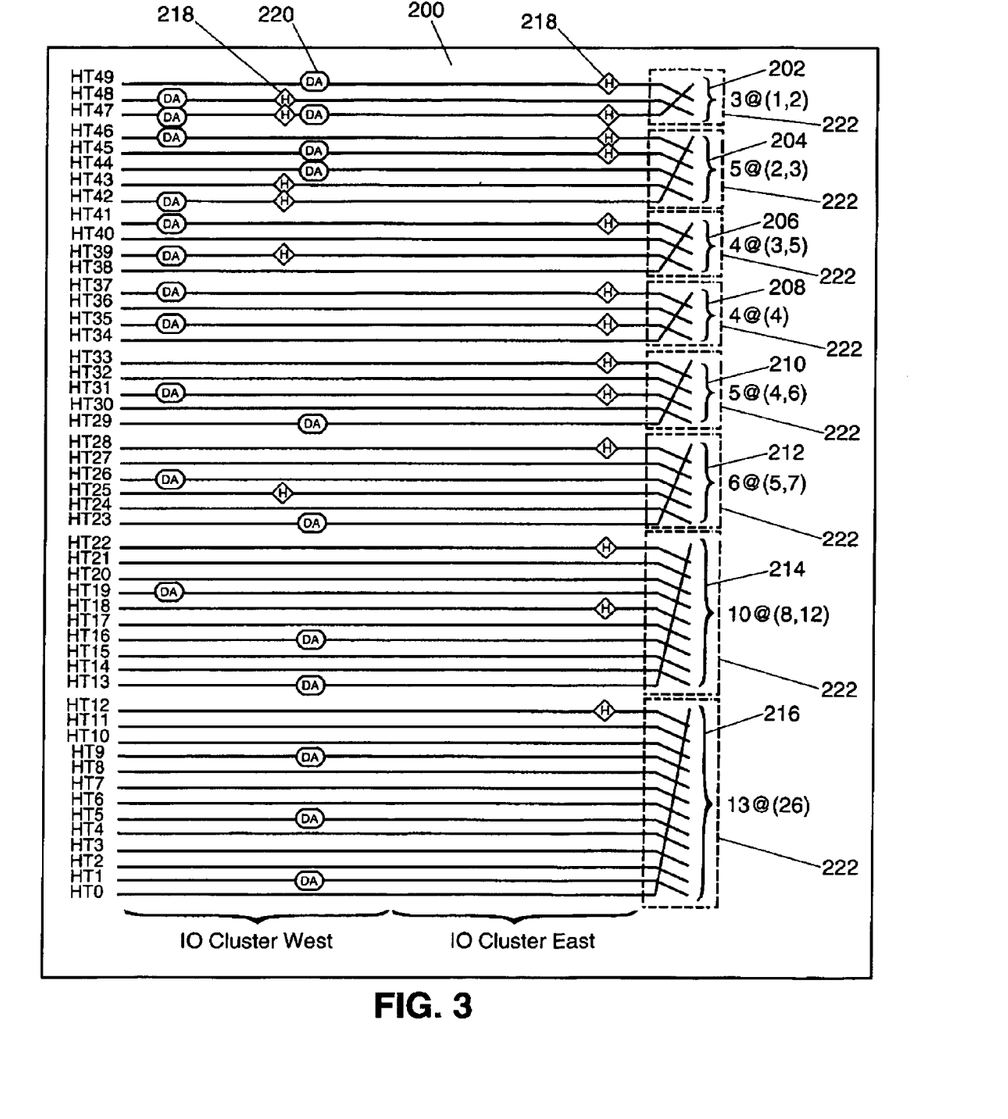
FIG. 3 is a simplified schematic diagram illustrating the horizontal segmentation pattern between logic cluster columns.

FIG. 3 is a simplified schematic diagram illustrating the horizontal segmentation pattern 200 between logic cluster 110 columns. Non-uniform segmented horizontal channel 200 comprises 50 tracks (HT0-HT49) divided into horizontal channel groups 202, 204, 206, 208, 210, 212, 214, 216. As set forth above, each horizontal segmentation pattern group is into a length as wide as a logic cluster 110 columns. The horizontal channel groups each independently generate a distinct set of track segments with a given segmentation. The groups are assembled together to create a routing channel with the desired number of tracks and the desired track-segment lengths and offsets.

Horizontal channel group 202 comprises three tracks HT49, HT 48 and HT47. Tracks HT49 and HT48 each have a direct address device 220 and a programmable element 218. For illustrative purposes only and in no way meant to limit the present disclosure, in this example programmable element 218 comprises an antifuse and direct address devices 220 may comprise pass transistors. As is well known to those of ordinary skill in the art, direct address devices are employed to program a corresponding programmable element when a programmable element is to be programmed. Programmable elements 218 are the offsets or starting points of the next segments in tracks HT49 and HT 48 and for all other tracks in horizontal segmentation pattern 200. Offsets enable greater flexibility in the circuit given that a signal may traverse horizontal and/or vertical track via any starting point as well as traveling different distances via the varying length track segments.

Track HT47 has two direct address devices 220 and two programmable elements 218. At one end of horizontal channel group 202 there is a cross-over 222 immediately before the horizontal channel group 202 segment repeats wherein track position HT47 crosses-over to track position HT49. At the next segment repetition, track position HT48 will crossover to track position HT49 (formerly track HT47). Horizontal tracks HT47-HT49 and all the tracks (horizontal and vertical) discussed below lay on the same layer on the die. The crossover is accomplished by laying the last track (or wire) over the first number of wires so that the last wire becomes the first. In effect, the crossover produces a twist of the wires.

The result of repeating horizontal channel group 202 is that each track segment has a unit length of one and then a unit length of two and an offset at track segment lengths of one and two and repeats in this pattern producing non-uniform track segments. The unit lengths, for purposes of example only, in this embodiment are equal to a track segment length. Thus, a repeating uniform segment results in a non-uniform segmented track. This will be discussed in greater detail below.

In another illustrative example, horizontal channel group 204 comprises five tracks HT46, HT45, HT44, HT43 and HT42. Tracks HT46, HT45, HT44 and HT42 each have a direct address device 220 and a programmable element 218. As set forth above in this example programmable element 218 is an antifuse. Track HT44 has a direct address device 220. Track HT43 has a programmable element 218. At one end of horizontal channel group 204 there is a crossover 222 just before the horizontal channel group 204 segment repeats wherein track position HT42 crosses over to track position HT46. At the next segment repetition, track position HT43 will crossover to track position HT46 (formerly track position HT42). The result of repeating horizontal channel group 204 is that each track segment has a unit length of two and then a unit length of three and offsets at track segment unit lengths of two and three and repeats in this pattern. Thus, each track ends up having different segment lengths and offset points even though the same block is being stepped and repeated to produce the array.

Horizontal channel group 206 comprises four tracks HT41, HT40, HT39 and HT38. Tracks HT41 and HT39 each have a direct address device 220 and a programmable element 218. Tracks HT40 and HT38 do not have a direct address device or a programmable element. At one end of horizontal channel group 206 there is a cross-over 222 just before the horizontal channel group 206 segment repeats wherein track position HT38 crosses-over to track position HT41. At the next segment repetition, track position HT39 crosses-over to track position HT41 (formerly track position HT38). The result of repeating horizontal channel group 206 is that each track segment has a unit length of three and then a unit length of five and offsets at track segment unit lengths of three and five and repeats in this pattern. Thus, each track ends up having different segment lengths and offset points even though the same block is being stepped and repeated to produce the array.

Horizontal channel group 208 comprises four tracks HT37, HT36, HT35 and HT34. Tracks HT37 and HT35 each have a direct address device 220 and a programmable element 218. Tracks HT40 and HT38 do not have a direct address device or a programmable element. At one end of horizontal channel group 208 there is a cross-over 222 just before the horizontal channel group 208 segment repeats wherein track position HT34 crosses over to track position HT37. At the next segment repetition, track position HT35 crosses over to track position HT37 (formerly track position HT34). The result of repeating horizontal channel group 208 is that each track segment has a unit length of four and an offset at track segment length of four and repeats in this pattern.

Horizontal channel group 210 comprises five tracks HT33, HT32, HT31, HT30 and HT29. Track HT31 has a direct address device 220 and a programmable element 218. Track HT33 has a programmable element 218. Track HT29 has a direct address device 220. Tracks HT30 and HT32 do not have a direct address device or a programmable element. At one end of horizontal channel group 210 there is a cross-over 222 just before the horizontal channel group 210 segment repeats wherein track position HT29 crosses-over to track position HT33. At the next segment repetition, track position HT30 crosses-over to track position HT33 (formerly track position HT29). The result of repeating horizontal channel group 210 is that each track segment has a unit length of four and then a unit length of six and an offset at track segment unit length of four and six and repeats in this pattern. Thus, each track ends up having different segment lengths and offset points even though the same block is being stepped and repeated to produce the array.

Horizontal channel group 212 comprises six tracks HT28, HT27, HT26, HT25, HT 24 and HT23. Tracks HT28 and HT25 each have a programmable element 218. Tracks HT26 and HT23 each have a direct address device 220. At one end of horizontal channel group 212 there is a cross-over 222 just before the horizontal channel group 212 segment repeats wherein track position HT23 crosses-over to track position HT28. At the next segment repetition, track position HT24 crosses-over to track position HT28 (formerly track position HT23). The result of repeating horizontal channel group 212 is that each track segment has a unit length of five and then a unit length of seven and an offset at track segment unit length of five and seven and repeats in this pattern. Thus, each track segment ends up having different segment lengths and offset points even though the same block is being stepped and repeated to produce the array.

Horizontal channel group 214 comprises ten tracks HT22, HT21, HT20, HT19, HT18, HT17, HT16, HT15, HT14 and HT13. Tracks HT19, HT16 and HT13 each have a direct address device 220. Tracks HT22 and HT18 has a programmable element. At one end of horizontal channel group 214 there is a cross-over 222 just before the horizontal channel group 214 segment repeats wherein track position HT13 crosses-over to track position HT22. At the next segment repetition, track position HT14 crosses-over to track position HT22 (formerly track position HT13). The result of repeating horizontal channel group 214 is that each track segment has a unit length of eight and then a unit length of twelve and offsets at track segment unit lengths of eight and twelve and repeats in this pattern. Thus, each track ends up having different segment lengths and offset points even though the same block is being stepped and repeated to produce the array.

Finally, horizontal channel group 216 comprises thirteen tracks HT12, HT11, HT10, HT9, HT8, HT7, HT6, HT5, HT4, HT3, HT2, HT1 and HT0. Tracks HT9, HT5 and HT1 each have a direct address device 220. Track HT12 has a programmable element. At one end of horizontal channel group 216 there is a cross-over 222 just before the horizontal channel group 216 segment repeats wherein track position HT0 crosses-over to track position HT12. At the next segment repetition, track position HT1 crosses-over to track position HT12 (formerly track position HT0). The result of repeating horizontal channel group 216 is that each track segment has a unit length of twenty-six and an offset at a track segment unit length of twenty-six and repeats in this pattern.

As those skilled in the art having the benefit of this disclosure will readily recognize, the above examples are illustrative only and are in no meant to limit the present invention. As is obvious from the present disclosure, one could vary the number and location of programmable elements 218 and direct address devices 220 to vary the length of any of the track segments and the location of offsets in any given set or sets of channel groups. As also is apparent to those of ordinary skill in the art, the assignment of programmable elements, in this example antifuses, to either the right or left columns of the repeatable blocks will in general affect the track segment lengths that result. Also, the number of tracks in a "channel group" will also affect the length of the track segments.

Figure 4:
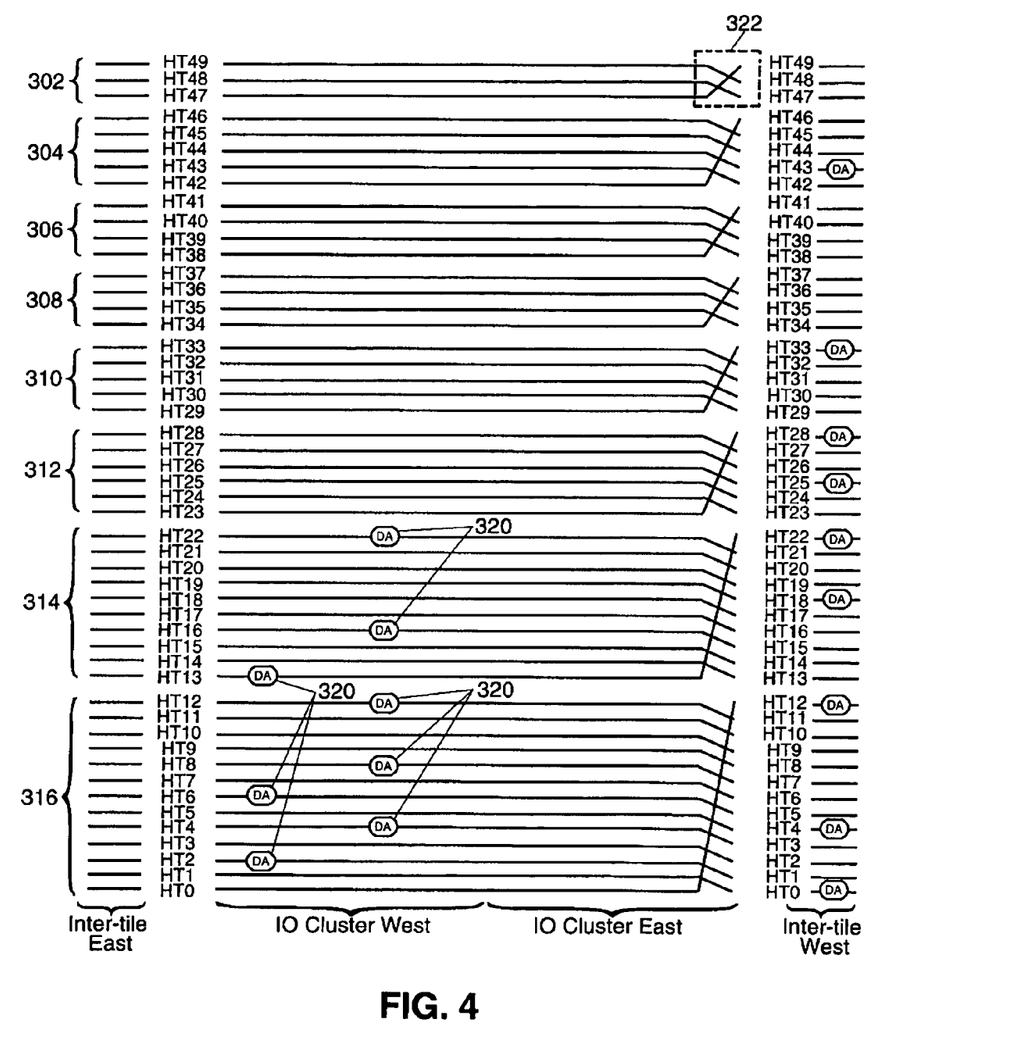
FIG. 4 is a simplified schematic diagram illustrating the horizontal segmentation pattern between a logic cluster column and an input/output cluster.

FIG. 4 is a simplified schematic diagram illustrating the horizontal segmentation pattern 300 between logic cluster 110 column and input/output cluster 104 as shown in FIGS. 1 and 2. Non-uniform horizontal channel 300 comprises 50 tracks (HT0-HT49) divided into horizontal channel groups 302, 304, 306, 308, 310, 312, and 314, 316. Non-uniform horizontal channel extends directly into the input/output cluster 104 columns. As shown in FIG. 4, there is no further segmentation through programmable elements. Horizontal channel groups 314 and 316 contain direct address devices 320 on tracks HT22, HT16, HT13, HT12, HT8, HT6, HT4, HT2. As set forth previously, direct address devices may comprise pass transistors. Horizontal channel groups 314 and 316 contain direct address devices 320 because the track lengths exceed a certain maximum number of unit lengths from the last direct address device 320 from inside core tile 100. In the present example, the maximum length equals five track lengths.

Figure 5:
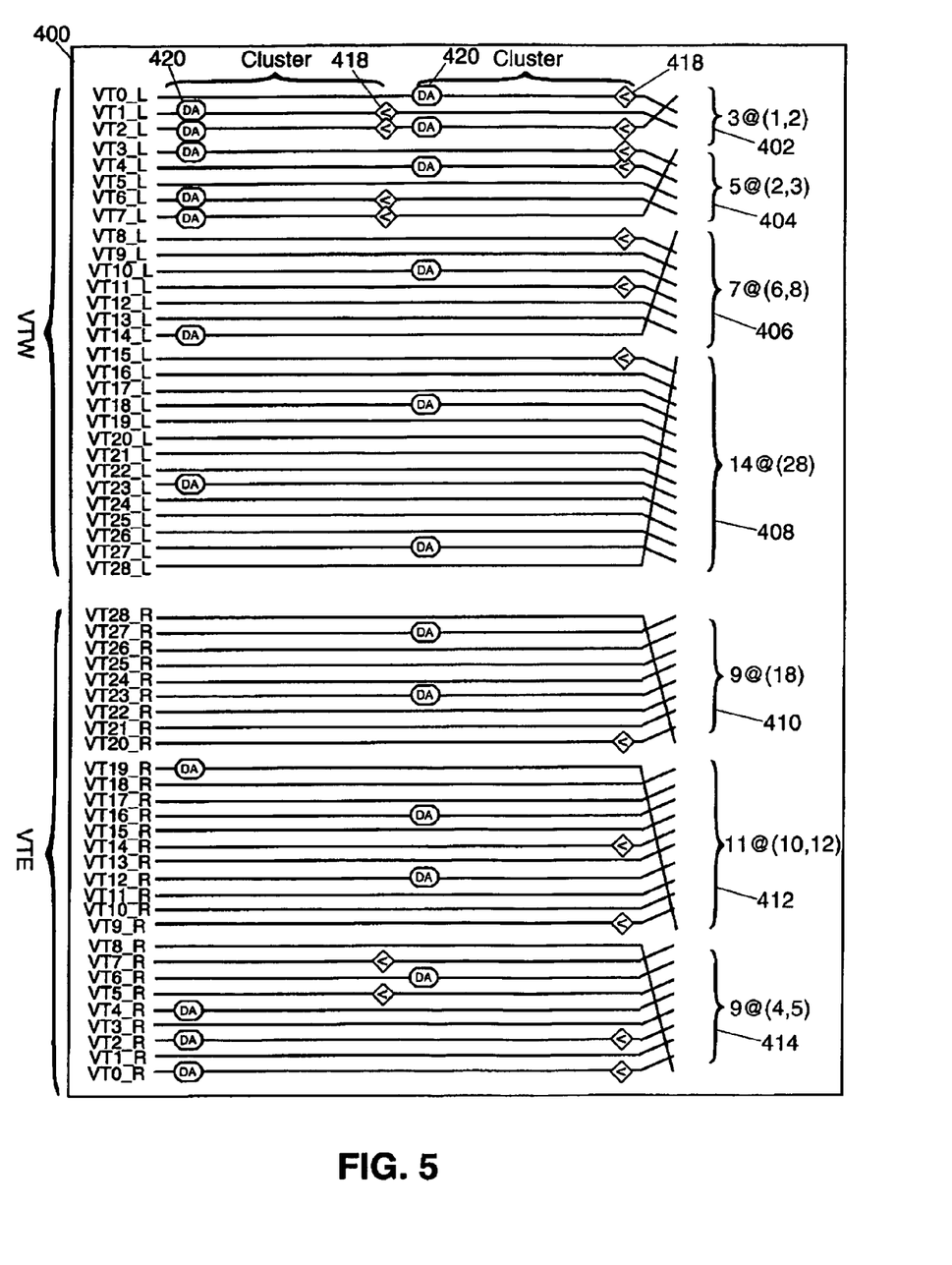
FIG. 5 is a simplified schematic diagram illustrating the vertical segmentation pattern for every two logic cluster rows.

FIG. 5 is a simplified schematic diagram illustrating the vertical segmentation pattern 400 for every two logic cluster 110 rows. Non-uniform segmented vertical channel 400 comprises 58 tracks (VT0-VT57) divided into vertical channel groups 402, 404, 406, 408, 410, 412, and 414. Each vertical segmentation pattern group is equal to two logic cluster 110 rows. As would be readily apparent to one skilled in the art having the benefit of this disclosure, the vertical segment channel length may be varied according to the requirements necessitated by the circuit design.

Vertical channel group 402 comprises three tracks VT57, VT56 and VT55. Track VT57 and VT56 each have a direct address device 420 and a programmable element 418. In this example, programmable element 418 is an antifuse and direct address device may comprise a pass transistor. Track VT55 has two direct address devices 420 and two programmable elements 418. At one end of vertical channel group 402 there is a cross-over 422 just before the vertical channel group 402 segment repeats wherein track position VT55 crosses-over to track position VT57. At the next segment repetition, track position VT56 crosses-over to track position VT57 (formerly track position VT55). The result of repeating vertical channel group 402 is that each track segment has a unit length of one and then a unit length of two and an offset at track segment unit length of one and two and repeats in this pattern. Thus, a repeating uniform segment results in a non-uniform segmented track. This will be discussed in greater detail below. Thus, each track ends up having different segment lengths and offset points even though the same block is being stepped and repeated to produce the array.

In another illustrative example, vertical channel group 404 comprises five tracks VT54, VT53, VT52, VT51 and VT50. Tracks VT54, VT53, VT51 and VT50 each have a direct address device 420 and a programmable element 418. As set forth above, in this example programmable element 418 is an antifuse. Track HT52 does not have a programmable element 418 or a direct address device. At one end of vertical channel group 404 there is a cross-over 422 just before the vertical channel group 404 segment repeats wherein track position VT50 crosses-over to track position VT54. At the next segment repetition, track position VT51 crosses-over to track position VT54 (formerly track position VT50). The result of repeating vertical channel group 404 is that each track segment has a unit length of two and then a unit length of three and offsets at track segment unit lengths two and three and repeats in this pattern. Thus, each track ends up having different segment lengths and offset points even though the same block is being stepped and repeated to produce the array.

Vertical channel group 406 comprises seven tracks VT49, VT48, VT47, VT46, VT45, VT44, and VT43. Tracks VT47 and VT43 each have a direct address device 420. Tracks VT49 and VT46 each have a programmable element 418. At one end of vertical channel group 406 there is a cross-over 422 just before the vertical channel group 406 segment repeats wherein track position VT43 crosses-over to track position VT49. At the next segment repetition, track position VT44 crosses-over to track position VT49 (formerly track position VT43). The result of repeating vertical channel group 406 is that each track segment has a unit length of six and then a unit length of eight and offsets at track segment unit lengths six and eight and repeats in this pattern. Thus, each track ends up having different segment lengths and offset points even though the same block is being stepped and repeated to produce the array.

Vertical channel group 408 comprises fourteen tracks VT42, VT41, VT40, VT39, VT38, VT37, VT36, VT35, VT34, VT33, VT32, VT31, VT 30 and VT29. Tracks VT39, VT34 and VT30 each have a direct address device 420. Track VT42 has a programmable element 418. At one end of vertical channel group 408 there is a cross-over 422 just before the vertical channel group 408 segment repeats wherein track position VT29 crosses-over to track position VT42. At the next segment repetition, track VT30 crosses-over to track position VT42 (formerly track position VT29). The result of repeating vertical channel group 408 is that each track segment has a unit length of twenty-eight and an offset at a track segment length twenty-eight and repeats in this pattern.

Vertical channel group 410 comprises nine tracks VT28, VT27, VT26, VT25, VT24, VT23, VT22, VT21 and VT20. Tracks VT27 and VT23 each have a direct address device 420. Track VT20 has a programmable element 418. At one end of vertical channel group 410 there is a cross-over 422 just before the vertical channel group 410 segment repeats wherein track position VT28 crosses-over to track position VT20. At the next segment repetition, track position VT27 crosses-over to track position VT20 (formerly track position VT28). The result of repeating vertical channel group 410 is that each track segment has a unit length of eighteen and an offset at a track segment length of eighteen and repeats in this pattern.

Vertical channel group 412 comprises eleven tracks VT19, VT18, VT17, VT16, VT15, VT14, VT13, VT12, VT11, VT10 and VT9. Tracks VT19, VT16 and VT12 each have a direct address device 420. Tracks VT14 and VT9 each have a programmable element 418. At one end of vertical channel group 412 there is a cross-over 422 just before the vertical channel group 412 segment repeats wherein track position VT19 crosses-over to track position VT9. At the next segment repetition, track position VT18 crosses-over to track position VT9 (formerly track position VT19). The result of repeating vertical channel group 412 is that each track segment has a unit length of ten and then a unit length of twelve and offsets at track segment unit lengths of ten and twelve and repeats in this pattern. Thus, each track ends up having different segment lengths and offset points even though the same block is being stepped and repeated to produce the array.

Vertical channel group 414 comprises nine tracks VT8, VT7, VT6, VT5, VT4, VT3, VT2, VT1 and VT0. Tracks VT6 and VT4 each have a direct address device 420. Tracks VT7 and VT5 each have a programmable element 418. Tracks VT2 and VT0 each have both a direct address device 420 and a programmable element 418. At one end of vertical channel group 414 there is a cross-over 422 just before the vertical channel group 414 segment repeats wherein track position VT8 crosses-over to track position VT0. At the next segment repetition, track position VT7 crosses-over to track position VT0 (formerly track position VT8). The result of repeating vertical channel group 414 is that each track has a unit length of four and then a unit length of five and offsets at track segment unit lengths of four and five and repeats in this pattern. Thus, each track ends up having different segment lengths and offset points even though the same block is being stepped and repeated to produce the array.

Figure 6:
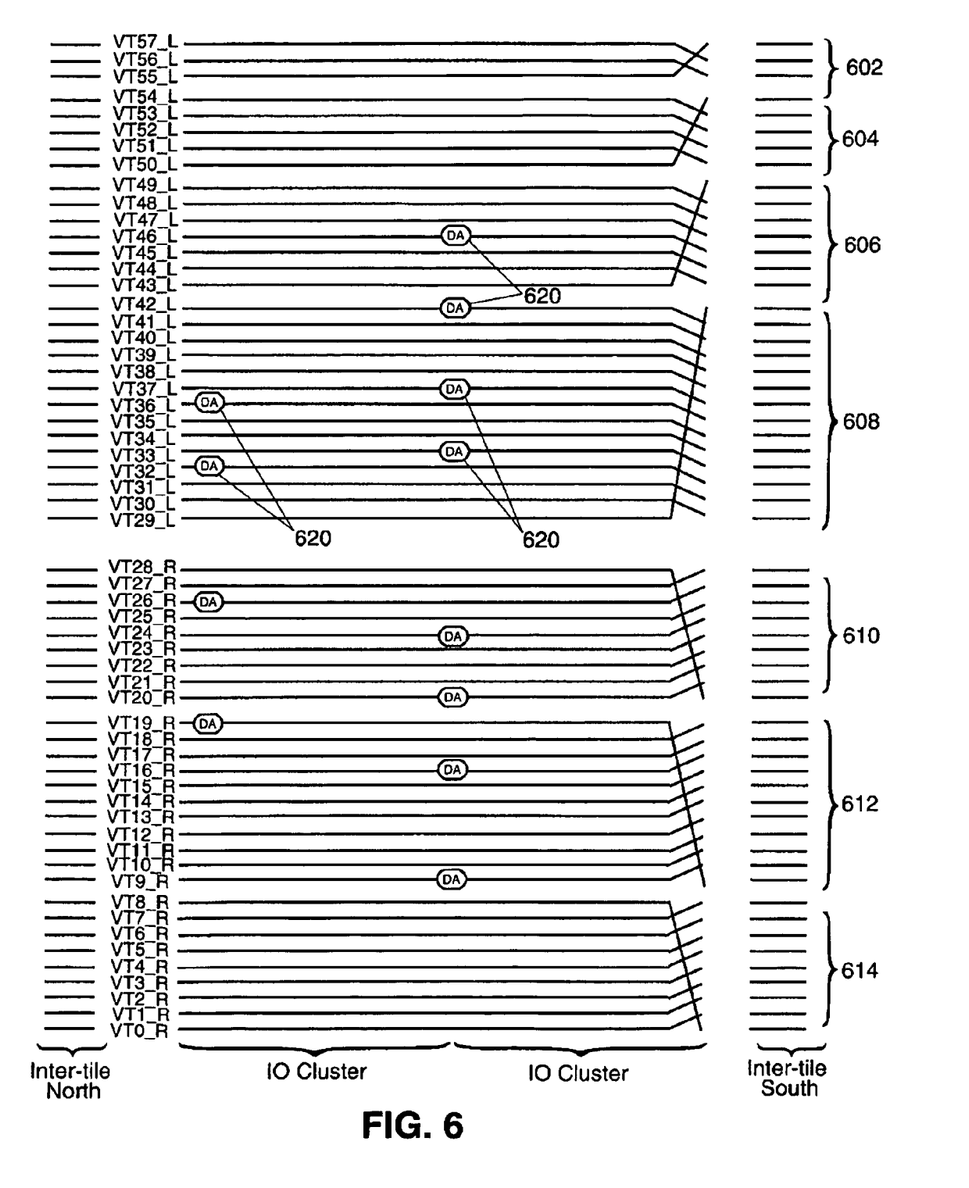
FIG. 6 is a simplified schematic diagram illustrating the vertical segmentation pattern between a logic cluster column and an input/output cluster as shown in FIGS. 1 and 2.

FIG. 6 is a simplified schematic diagram illustrating the vertical segmentation pattern 600 between logic cluster 110 column and input/output cluster 104 as shown in FIGS. 1 and 2. Non-uniform vertical channel 600 comprises 58 tracks (VT0-VT57) divided into vertical channel groups 602, 604, 606, 608, 610, 612, 614. Non-uniform vertical channel extends directly into the input/output cluster 104 columns. As shown in FIG. 4, there is no further segmentation through programmable elements. Vertical channel groups 606, 608, 610 and 612 contain direct address devices 620 on tracks VT46, VT42, VT37, VT36, VT33, VT32, VT26, VT24, VT20, VT19, VT16 and VT9. As set forth previously, direct address devices may comprise pass transistors. Vertical channel groups 606, 608, 610 and 612 contain direct address devices 620 because the track segment lengths exceed a certain number of unit lengths from the last direct address device 620 from inside core tile 100. In the present example, the unit length equals five from the last direct address device 620 from inside core tile 100.

The non-uniform segmented channel array of the present system provides a variety of track-segment lengths and offsets, and thus is more flexible and faster than a device having a uniform segmented channel array. For example, in the present non-uniform segmented channel array, if a signal has to travel a track distance comprising a certain predetermined track length and starting from a certain predetermined position, it is more likely that that track length and offset (starting position) can be closely matched in a non-uniform segmented channel array due to the variety of track segment lengths and offsets to choose from. In addition, the uniform-segment blocks of the present system can be stepped and repeated to produce a non-uniform segmented channel array.

It should be understood that various alternatives to the embodiments of the disclosed method and apparatus described herein might be employed in practicing the disclosed method and using the disclosed apparatus. It is intended that the following claims define the scope of the disclosed method and apparatus and that methods and structures within the scope of these claims and their equivalents be covered thereby.

The invention claimed is:

1. A repeatable non-uniform segmented routing architecture in a field programmable gate array comprising:
   a repeatable block of routing tracks, the routing tracks grouped into sets of routing tracks, each set having a first routing track in a first track position, a second routing track in a last track position, a programmable element, and a direct address device for programming said programmable element;
   wherein at least one of said routing tracks is segmented into non-uniform lengths by said programmable element and said second routing track crosses-over to said first track position in a region adjacent to an edge of said repeatable block; and
   wherein a first plurality of said routing track sets proceed in a horizontal direction and a second plurality of said routing track sets proceed in a vertical direction.

2. The routing architecture of claim 1, wherein said first plurality and said second plurality of routing track sets are disposed on the same layer on a die.

3. The routing architecture of claim 1, wherein said programmable element comprises an antifuse.

4. The routing architecture of claim 1, wherein said direct address device comprises a pass transistor.

5. The routing architecture of claim 1, wherein each set of routing tracks in said first plurality of said routing track sets further comprises an additional routing track disposed in between said first routing track and said second routing track.

6. The routing architecture of claim 5, wherein said second routing track of said first plurality of said routing track sets crosses-over said additional routing track and said first routing track of said first plurality of said routing track sets to said first track position in a region adjacent to an edge of said repeatable block.

7. The routing architecture of claim 1, wherein each set of routing tracks in said second plurality of said routing track sets further comprises an additional routing track disposed in between said first routing track and said second routing track.

8. The routing architecture of claim 7, wherein said second routing track of said second plurality of said routing track sets crosses-over said additional routing track and said first routing track of said second plurality of said routing track sets to said first track position in a region adjacent to an edge of said repeatable block.

9. The routing architecture of claim 1, wherein said first plurality of said routing track sets is disposed between logic cluster columns on said field programmable gate array.

10. The routing architecture of claim 1, wherein said second plurality of said routing track sets extends directly into input/output cluster columns on said field programmable gate array.

11. The routing architecture of claim 1, wherein said first plurality and said second plurality of said routing track sets provide interconnections between logic clusters on said field programmable gate array.

12. The routing architecture of claim 1, wherein said programmable element is one-time programmable.

13. The routing architecture of claim 1, wherein said programmable element is re-programmable.

* * * * *